(12) United States Patent
Nomura et al.

(10) Patent No.: US 9,203,413 B2
(45) Date of Patent: Dec. 1, 2015

(54) SILICON-BASED OSCILLATOR FOR A DOWNHOLE TOOL

(71) Applicant: Schlumberger Technology Corporation, Sugar Land, TX (US)

(72) Inventors: Toshihiro Nomura, Paris (FR); Patrick P. Vessereau, Hericy (FR); Nigel Greer, Clamart (FR)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

(21) Appl. No.: 14/098,449

(22) Filed: Dec. 5, 2013

(65) Prior Publication Data

US 2014/0159823 A1  Jun. 12, 2014

(30) Foreign Application Priority Data

Dec. 6, 2012 (EP) .................................... 12306531

(51) Int. Cl.
*H03B 5/04* (2006.01)
*H03L 1/02* (2006.01)
*G04G 3/04* (2006.01)

(52) U.S. Cl.
CPC ... *H03L 1/02* (2013.01); *G04G 3/04* (2013.01)

(58) Field of Classification Search
USPC ............. 331/70, 66, 176, 117 R, 167, 117 FE
See application file for complete search history.

(56) References Cited

U.S. PATENT DOCUMENTS

| 5,745,106 A * | 4/1998 | Chandavarkar ................ 345/213 |
| 6,980,062 B2 * | 12/2005 | Fujita ............................ 331/176 |
| 7,646,256 B2 * | 1/2010 | Moloudi .................... 331/117 R |
| 2006/0202771 A1 | 9/2006 | Seki et al. |
| 2009/0021311 A1 * | 1/2009 | Grewing et al. ................. 331/34 |
| 2010/0277246 A1 | 11/2010 | Seth et al. |
| 2011/0133846 A1 * | 6/2011 | Hsieh ....................... 331/117 FE |
| 2012/0206018 A1 | 8/2012 | Kawakubo et al. |

FOREIGN PATENT DOCUMENTS

| FR | 2279143 | 2/1976 |
| WO | 2006/098857 | 9/2006 |

OTHER PUBLICATIONS

Search report for the equivalent European patent application No. 12306531.0 issued on May 28, 2013.

* cited by examiner

*Primary Examiner* — Joseph Chang
(74) *Attorney, Agent, or Firm* — Stephanie Chi; Jody DeStefanis

(57) ABSTRACT

Systems, methods, and assemblies to provide clock signals to electrical components of downhole tools are provided. In one example, an oscillator assembly may include a silicon-based oscillator having a variable capacitor circuit. The silicon-based oscillator may provide an output signal at a frequency within a range of frequencies. The oscillator assembly may also include control circuitry electrically coupled to the silicon-based oscillator. Moreover, the control circuitry may include a temperature input that receives a temperature corresponding to the silicon-based oscillator. The control circuitry may also include a control signal output electrically coupled to the silicon-based oscillator. The control signal output may be used to change a capacitance of the variable capacitor circuit based on the temperature received by the temperature input to maintain the output signal of the silicon-based oscillator within the range of frequencies.

15 Claims, 5 Drawing Sheets

SILICON-BASED OSCILLATOR FOR A DOWNHOLE TOOL

BACKGROUND

This disclosure relates to using silicon-based oscillators to provide a clock signal to electronic devices in high temperature, high pressure, or high shock environments.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions.

Tools used in a downhole environment often operate in extreme conditions, such as high temperature, high pressure, and/or high shock conditions. Such downhole tools include, for example, measurement-while-drilling (MWD) tools, logging-while-drilling (LWD) tools, wireline tools, coiled tubing tools, testing tools, completions tools, productions tools, or combinations thereof. In one example of a MWD system, a drill bit attached to a long string of drill pipe, generally referred to as the drill string, may be used to drill a borehole for an oil and/or gas well. In addition to the drill bit, the drill string may also include a variety of downhole tools to measure or log properties of the surrounding rock formation or the conditions in the borehole. In certain configurations, downhole tools may be used that are not part of a drill string. In either configuration, downhole tools often operate in extreme environments.

Various electrical systems have been developed to operate in extreme environments. These systems may include electrical components that operate using a clock signal. These systems, however, have many disadvantages. For example, a crystal oscillator with a hermetic seal used to produce a clock signal may operate accurately in high temperature environments, but may operate unreliably in high pressure environments. Likewise, a micro-electro-mechanical system (MEMS) based oscillator used to produce a clock signal may operate unreliably in high temperature, high pressure environments.

In some systems, a clock signal may originate from a non-extreme environment and may be provided to electrical components operating in an extreme environment via cabling. However, providing a clock signal from a non-extreme environment to an extreme environment via cabling may be difficult due to a quantity of clock signals desired, a speed of the clock signals, and multiple electrical connections between the non-extreme environment and the extreme environment. For example, a large number of conductors may be used for a large number of clock signals. However, there may be insufficient space for the large number of conductors. Furthermore, high speed clock signals may be difficult to transmit over long cables. Moreover, multiple electrical connections may distort the clock signals and/or introduce noise.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to systems, methods, and assemblies to provide clock signals to electrical components of downhole tools exposed to extreme environments. The present techniques may apply to downhole tools including but not limited to any MWD tool, LWD tool, wireline tool, coiled tubing tool, testing tool, completions tool, production tool, or combinations thereof. In one example, an oscillator assembly may include a silicon-based oscillator having a variable capacitor circuit. The silicon-based oscillator may provide an output signal at a frequency within a range of frequencies. The oscillator assembly may also include control circuitry electrically coupled to the silicon-based oscillator. Moreover, the control circuitry may include a temperature input that receives a temperature corresponding to the silicon-based oscillator. The control circuitry may also include a control signal output electrically coupled to the silicon-based oscillator. The control signal output may be used to change a capacitance of the variable capacitor circuit based on the temperature received by the temperature input to maintain the output signal of the silicon-based oscillator within the range of frequencies.

In another example, a method may include detecting a temperature using a temperature sensor of an oscillator assembly. Moreover, the method may also include determining output control signals using control circuitry of the oscillator assembly based on the detected temperature. The method may include providing the output control signals from the control circuitry to a silicon-based oscillator of the oscillator assembly. The silicon-based oscillator may include an inductor circuit and a variable capacitor circuit. Furthermore, the method may include providing a clock signal from the silicon-based oscillator. A frequency of the clock signal may be determined using the inductor circuit, the variable capacitor circuit, and the output control signals.

In a further example, a system may include a downhole tool that measures parameters related to the system and/or a rock formation. Moreover, the system may also include an oscillator assembly that provides a clock signal to electronics of the downhole tool. The oscillator assembly may be located outside of a shielded cartridge of the downhole tool. Furthermore, the oscillator assembly may include a silicon-based oscillator having a variable capacitor circuit. The silicon-based oscillator may provide the clock signal at a frequency within a range of frequencies. The oscillator assembly may also include control circuitry electrically coupled to the silicon-based oscillator. The control circuitry may include a reference input that receives a reference signal. The control circuitry may also include control signal outputs electrically coupled to the silicon-based oscillator and used to change a capacitance of the variable capacitor circuit based on the reference input received to maintain the clock signal of the silicon-based oscillator within the range of frequencies.

Various refinements of the features noted above may exist in relation to various aspects of this disclosure. Further features may also be incorporated in these various aspects as well. These refinements and additional features may exist individually or in any combination. For instance, various features discussed below in relation to one or more of the illustrated embodiments may be incorporated into any of the above-described aspects of this disclosure alone or in any combination. The brief summary presented above is intended to familiarize the reader with certain aspects and contexts of embodiments of this disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

Figure 1:
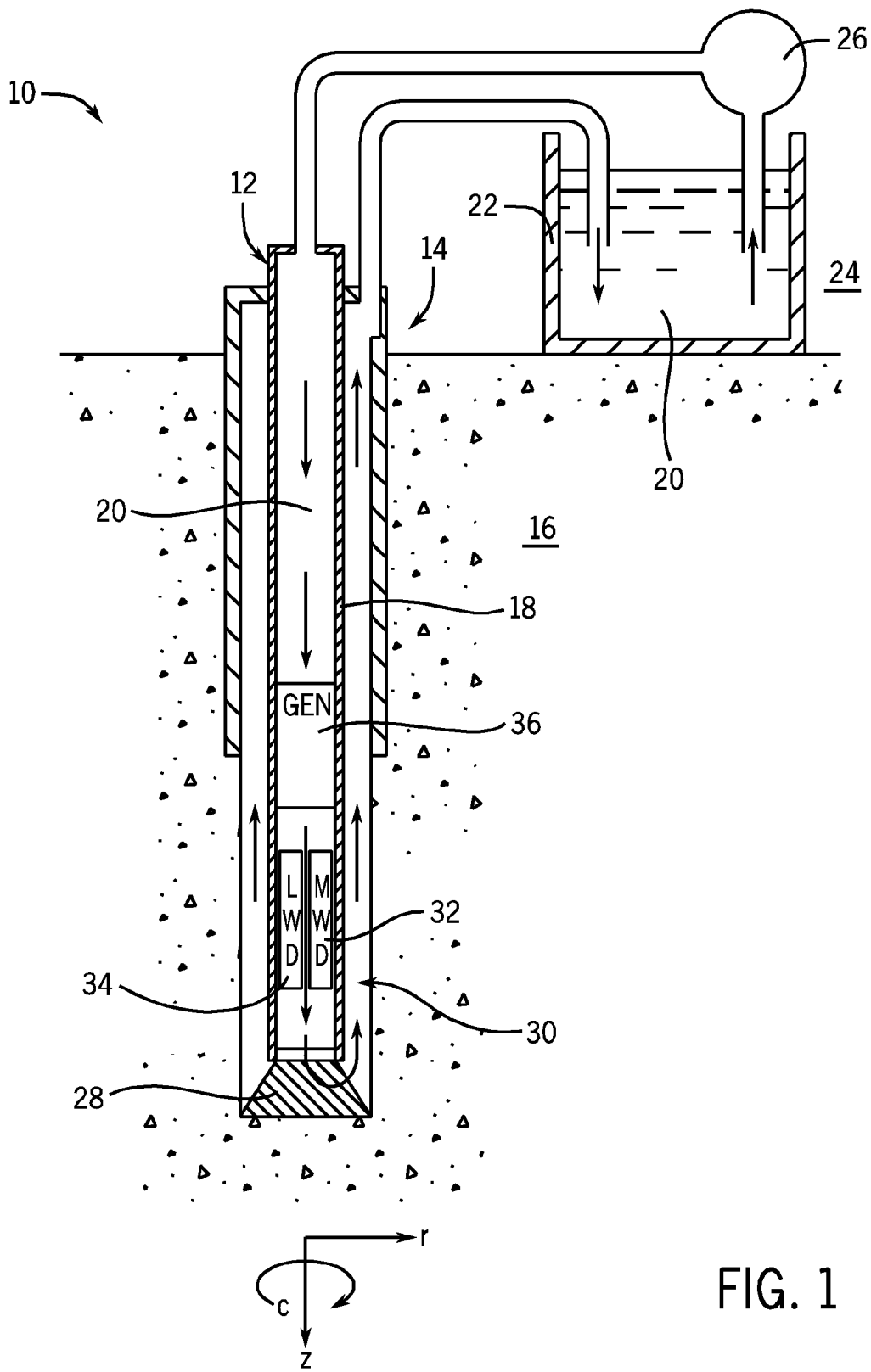
FIG. 1 is a schematic diagram of a downhole tool that employs a silicon-based oscillator for operating in extreme environments, in accordance with an embodiment.

One or more specific embodiments of the present disclosure will be described below. These described embodiments are examples of the presently disclosed techniques. Additionally, in an effort to provide a concise description of these embodiments, certain features of an actual implementation may not be described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As mentioned above, this disclosure relates to a silicon-based oscillator that provides a clock signal to electrical devices for downhole tools. For example, drilling a borehole for an oil and/or gas well often involves a drill string—several drill pipes and a drill bit, among other things—that grinds into a rock formation when drilling fluid is pumped through the drill string. In addition to the drill bit, the drill string may also include several electrically powered tools. The tools in the drill string may include, for example, logging-while-drilling (LWD) tools, measurement-while-drilling (MWD) tools, steering tools, and/or tools to communicate with drilling operators at the surface.

In general, the borehole may be drilled by pumping drilling fluid into the tool string, causing the drill bit to rotate and grind away rock as the drilling fluid passes through. The hydraulic power of the drilling fluid may also be used to generate electricity. Specifically, a turbine generator may convert some of the hydraulic power of the drilling fluid into electrical power. During operation of the tool string, the electrically powered tools may be exposed to extreme environmental conditions, such as high temperature, high pressure, and high shock environments. Furthermore, a clock used to provide timing signals to the electrically powered tools may be exposed to the extreme environmental conditions. Accordingly, the silicon-based oscillator described in this disclosure may be used to provide a clock and may provide a number of advantages. For example, silicon-based oscillator may operate reliably in extreme environmental conditions, such as high temperature, high pressure, and high shock environments. Accordingly, the silicon-based oscillator may be physically located within the extreme environmental conditions.

A downhole tool 10, shown in FIG. 1, may benefit from the silicon-based oscillator mentioned above. The downhole tool 10 of FIG. 1 includes a drill string 12 used to drill a borehole 14 into a rock formation 16. A drill collar 18 of the drill string 12 encloses the various components of the drill string 12. Drilling fluid 20 from a reservoir 22 at a surface 24 may be driven into the drill string 12 by a pump 26. The hydraulic power of the drilling fluid 20 causes a drill bit 28 to rotate, cutting into the rock formation 16. The cuttings from the rock formation 16 and the returning drilling fluid 20 exit the drill string 12 through a space 30. The drilling fluid 20 thereafter may be recycled and pumped, once again, into the drill string 12.

A variety of information relating to the rock formation 16 and/or the state of drilling of the borehole 14 may be gathered while the drill string 12 drills the borehole 14. For instance, a measurement-while-drilling (MWD) tool 32 may measure certain drilling parameters, such as the temperature of the drilling tool, pressure on the drilling tool, orientation of the drilling tool, and so forth. Likewise, a logging-while-drilling (LWD) tool 34 may measure the physical properties of the rock formation 16, such as density, porosity, resistivity, and so forth. These tools and other tools may rely on electrical power for their operation. As such, a turbine generator 36 may generate electrical power from the hydraulic power of the drilling fluid 20.

As seen in FIG. 1, the drill string 12 is generally aligned along a longitudinal z-axis. Components of the drill string 12 may be located within the drill string at various radial distances from the z-axis, as illustrated by a radial r-axis. Certain components, such as the turbine generator 36 may include parts that rotate circumferentially along a circumferential c-axis.

Figure 2:
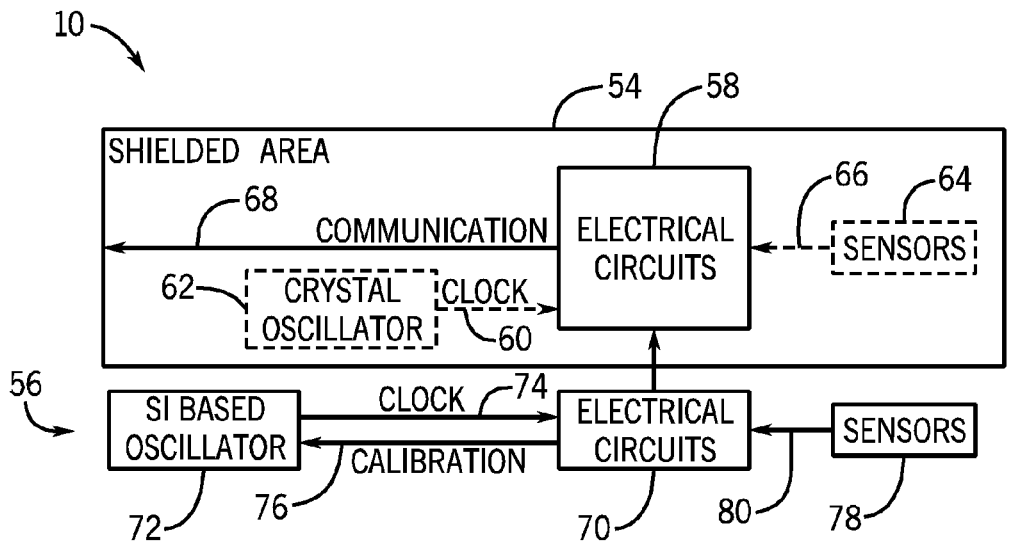
FIG. 2 is a block diagram of a segment of a downhole tool with a silicon-based oscillator outside of a shielded area, in accordance with an embodiment.

One type of silicon-based oscillator is illustrated as part of the downhole tool 10 of FIG. 2. Although illustrated as being part of the downhole tool 10, the silicon-based oscillator may be part of any suitable downhole tool. As illustrated, the downhole tool 10 may include a shielded area 54 (e.g., shielded cartridge) and an unshielded area 56 (e.g., outside of the shielded cartridge). The shielded area 54 is constructed to be protected from extreme environmental conditions. Accordingly, electrical components within the shielded area 54 may not be exposed to high temperatures, high pressures, and/or high shock environments.

The shielded area 54 may include electrical circuits 58 that operate using clock signals 60 generated by a crystal oscillator 62. Because the crystal oscillator 62 is physically located within the shielded area 54, the crystal oscillator 62 may provide stable and/or reliable clock signals 60 to the electrical circuits 58. However, if the crystal oscillator 62 were physically located outside of the shielded area 54 (in the unshielded area 56), the crystal oscillator 62 may provide unstable and/or unreliable clock signals 60 to the electrical circuits 58.

Sensors 64 may also be within the shielded area 54 and may provide measurement signal 66 to the electrical circuits 58. The sensors 64 may be any suitable sensors for making measurements, such as temperature sensors, pressure sensors, flow sensors, accelerometers, and so forth. The sensors 64 may also be formation-measuring sensors such as resistivity, nuclear magnetic resonance (NMR), nuclear radiation detectors, and so forth. In certain embodiments, the electrical circuits 58 may process the measurement signal 66 and/or other signals. The electrical circuits 58 communicate with other devices using a communication link 68. Accordingly, the electrical circuits 58 may provide other devices with measurements and/or other data.

Electrical circuits 70 are also physically located in the unshielded area 56 and electrically coupled to the electrical circuits 58 such that the electrical circuits 70 may provide the electrical circuits 58 with data. The electrical circuits 58 and/or 70 may include a variety of electronics, such as processors, analog circuits (e.g., such as switched capacitor filters and phase locked loops (PLLs) for amplifying and filtering), analog-to-digital converters (ADCs), digital-to-analog converters (DACs), microcontrollers, digital signal processors (DSPs) (e.g., for digital processing), telemetry circuits (e.g., for communication), power supplies, and so forth. Many of the electronics of the electrical circuits 58 and 70 use clock signals for their operation.

Accordingly, a silicon-based oscillator assembly 72 is electrically coupled to the electrical circuits 70 and provides a clock signal 74 (or clock signals) to the electrical circuits 70. The silicon-based oscillator assembly 72 may provide a reliable and/or stable clock signal 74 even when exposed to extreme environmental conditions, such as high pressure, high temperature, and/or high shock environments. For example, the silicon-based oscillator assembly 72 may operate reliably when exposed to temperatures between approximately −40 to 225 degrees Celsius. In other embodiments, the silicon-based oscillator assembly 72 may operate in temperatures ranges that extend to temperatures below −40 degrees Celsius and/or extend to temperatures above 225 degrees Celsius. As another example, the silicon-based oscillator assembly 72 may operate reliably when exposed to pressures up to 30,000 psi, or more. Furthermore, the clock signal 74 may have little or no impact from crosstalk, attenuation, and/or reflection that may be present when a clock signal is provided from the shielded area 54 to the unshielded area 56. In addition, long cables and/or multiple conductors may not extend between the shielded area 54 and the unshielded area 56. As may be appreciated, the silicon-based oscillator assembly 72 may be mounted in a plastic package and/or a multi-chip module (MCM). In addition, the silicon-based oscillator assembly 72 may not be enclosed within a hermetic package, thereby facilitating improved reliability when operating in a high pressure environment.

As illustrated, the electrical circuits 70 may provide a calibration signal 76 to the silicon-based oscillator assembly 72. The calibration signal 76 may be used to change the output frequency of the silicon-based oscillator assembly 72 based on environmental conditions, such as high temperature, high pressure, and/or high shock environments, such as to maintain the output frequency within a desired range of frequencies. Accordingly, the calibration signal 76 may be based on a reference clock, a sensed temperature, or any other suitable data. For example, sensors 78 may also be physically located in the unshielded area 56 and may provide measurement signal 80 to the electrical circuits 70. The electrical circuits 70 may use the measurement signal 80 to generate the calibration signal 76. The sensors 78 may be any suitable sensors for making measurements, such as temperature sensors, pressure sensors, flow sensors, accelerometers, and so forth. The sensors 78 may also be formation-measuring sensors such as resistivity, nuclear magnetic resonance (NMR), nuclear radiation detectors, and so forth. In contrast to the crystal oscillator 62, the silicon-based oscillator assembly 72 may be calibrated during operation to operate in extreme environmental conditions. Accordingly, the silicon-based oscillator assembly 72 may provide stable and/or reliable clock signals 74 even when physically located in the unshielded area 56.

Figure 3:
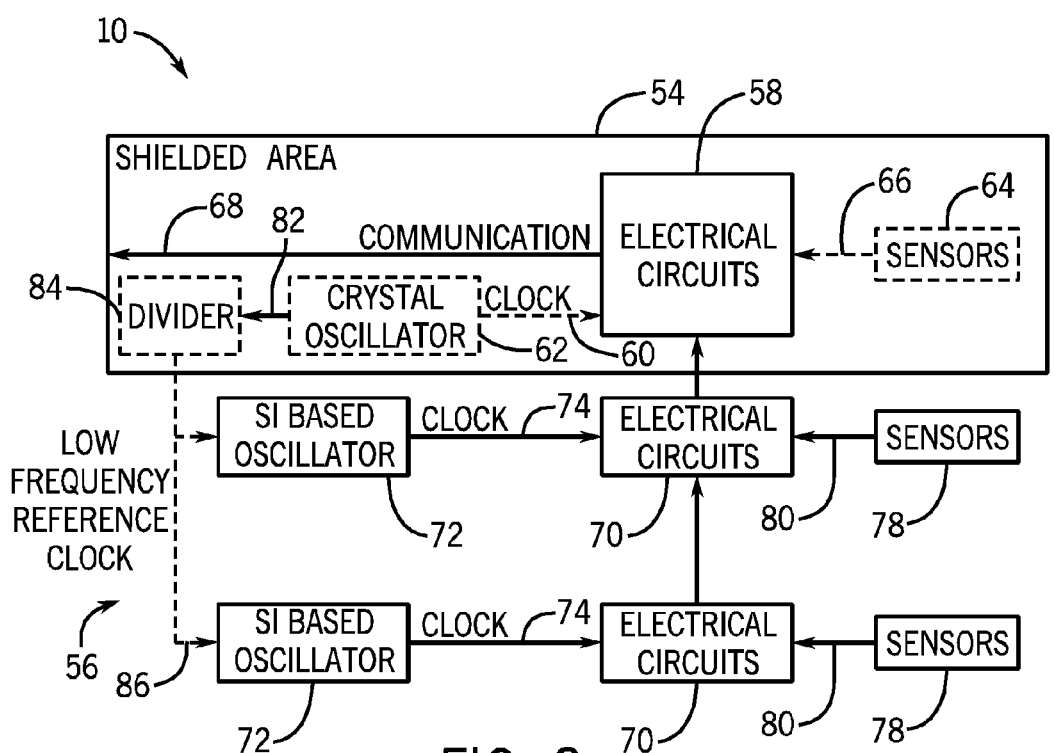
FIG. 3 is a block diagram of a segment of a downhole tool with multiple silicon-based oscillators outside of a shielded area, in accordance with an embodiment.

The silicon-based oscillator assembly 72 may be calibrated using a reference clock provided by the crystal oscillator 62, as illustrated in FIG. 3. Specifically, the crystal oscillator 62 may provide a clock signal 82 to a divider 84. The divider 84 may reduce the rate of the clock signal 82 from a high frequency clock signal to output a low frequency reference clock signal 86 that is provided to the silicon-based oscillator assembly 72. As illustrated, the low frequency reference clock signal 86 may be provided to more than one silicon-based oscillator assembly 72. The low frequency reference clock signal 86 may be used by the silicon-based oscillator assemblies 72 to calibrate the frequency of their output clock signals 74. By using the divider 84, the clock signal 82 from the crystal oscillator 62 may be reduced sufficiently to decrease the impact of crosstalk, attenuation, and/or reflections. Furthermore, the low frequency reference clock signal 86 may be output from the shielded area 54 to the unshielded area 56 using a single connection to minimize the number of conductors extending between the shielded area 54 and the unshielded area 56.

Figure 4:
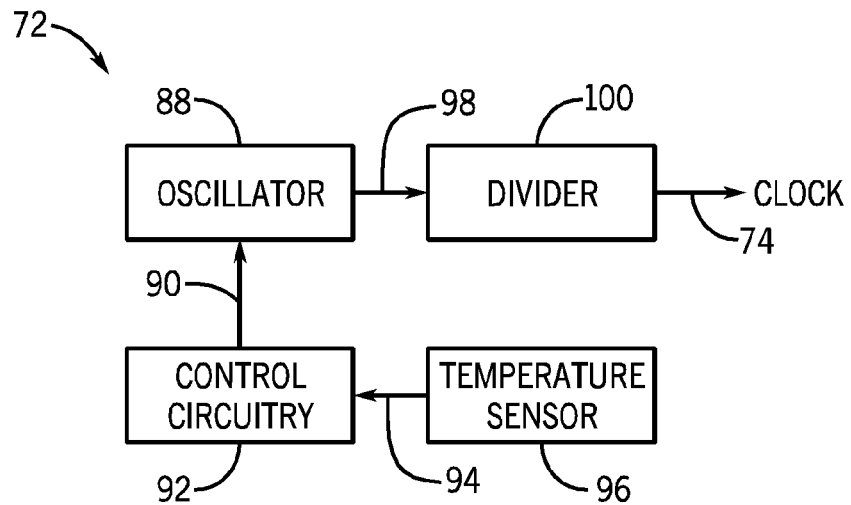
FIG. 4 is a block diagram of an oscillator assembly with a silicon-based oscillator using a temperature input, in accordance with an embodiment.

Silicon-based oscillator assemblies 72 may include electrical components to self calibrate their output clock signal as shown in FIG. 4. The silicon-based oscillator assembly 72 includes a silicon-based oscillator 88 (e.g., such as an LC oscillator, RC oscillator, ring oscillator, or any suitable silicon-based oscillator). The silicon-based oscillator 88 may receive control signal outputs 90 from control circuitry 92. The control circuitry 92 may include software, firmware, a microcontroller, DSPs, and/or any other suitable hardware or software. The control circuitry 92 is electrically coupled to the silicon-based oscillator 88 and provides the control signal outputs 90 to the silicon-based oscillator 88 to facilitate the silicon-based oscillator 88 maintaining its output clock frequency 74 within a range of frequencies (e.g., tolerance such as +/−1% of a desired output frequency). As may be appreciated, the control signal outputs 90 may also be used to set, change, and/or adjust the output clock frequency 74 of the silicon-based oscillator 88. The control circuitry 92 may be programmed to control the silicon-based oscillator 88 to output a specific clock frequency. For example, electrical circuits 70 external to the silicon-based oscillator assembly 72 (e.g., a microcontroller) may be used to program the control circuitry 92 before or during operation. Moreover, the control circuitry 92 may be preset to control the silicon-based oscillator 88 to an initial clock frequency (e.g., hardwired, preprogrammed, etc.).

The control circuitry 92 may receive a temperature signal 94 from a temperature sensor 96. The temperature sensor 96 may be physically located to detect a temperature of the silicon-based oscillator 88, a temperature within the silicon-based oscillator assembly 72, or a temperature outside the silicon-based oscillator assembly 72. Accordingly, the control circuitry 92 may use the detected temperature to determine a change to be made to the silicon-based oscillator 88 to maintain the output clock frequency 74 within the range of frequencies.

The silicon-based oscillator 88 may be controlled to provide a clock frequency 98 that is greater than the output clock frequency 74 of the silicon-based oscillator assembly 72. Accordingly, the silicon-based oscillator assembly 72 may include a divider 100 that receives the clock frequency 98 from the silicon-based oscillator 88 and reduces the clock frequency 98 to the output clock frequency 74. For example, the divider 100 may reduce the clock frequency 98 by approximately 50%, 75%, 90%, and so forth. In other embodiments, the silicon-based oscillator assembly 72 may include a multiplier that receives the clock frequency 98 from the silicon-based oscillator 88 and increases the clock frequency 98 to the output clock frequency 74. In yet other embodiments, the divider 100 may include both divider and multiplier circuitry. As may be appreciated, the clock frequency 98 may be a multiple of the output clock frequency 74 to facilitate even division and/or multiplication of the clock frequency 98. The divider 100 may be programmed before or during operation to a specific division ratio via electrical circuits 70 external to the silicon-based oscillator assembly 72 (e.g., a microcontroller). Furthermore, the divider 100 may be preset to an initial division ratio (e.g., hardwired, preprogrammed, etc.).

The divider 100 and/or the control circuitry 92 may be used during operation of the silicon-based oscillator assembly 72 to change the output clock frequency 74. For example, if the output clock frequency 74 is too high, the divider 100 may be programmed to increase its division ratio or the control circuitry 92 may be programmed to reduce the clock frequency 98 output from the silicon-based oscillator 88. As another example, if the output clock frequency 74 is too low, the divider 100 may be programmed to decrease its division ratio or the control circuitry 92 may be programmed to increase the clock frequency 98 output from the silicon-based oscillator 88.

In certain embodiments, the initial frequency of the silicon-based oscillator 88 may be set after the silicon-based oscillator assembly 72 is powered on, but before temperature calibration is applied to the silicon-based oscillator 88. As may be appreciated, if the initial frequency is too high, the external electrical circuits 70 may not operate properly. Accordingly, the initial frequency may be set low to facilitate operation of the external electrical circuits 70.

Figure 5:
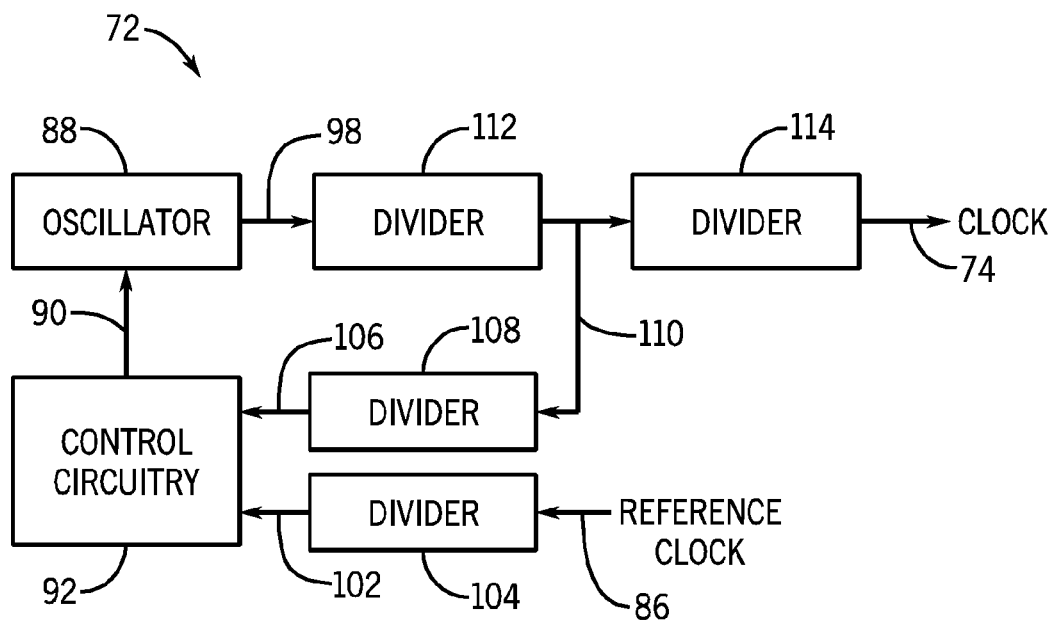
FIG. 5 is a block diagram of an oscillator assembly with a silicon-based oscillator using a reference clock, in accordance with an embodiment.

The silicon-based oscillator 88 may use a reference clock for calibration as shown in FIG. 5. The reference clock may be used in conjunction with temperature sensor calibration, or the reference clock may be used without temperature sensor calibration. The control circuitry 92 of the silicon-based oscillator assembly 72 may receive a reference clock signal 102 from a divider 104. The divider 104 receives the reference clock signal 86 and divides the reference clock signal 86 to provide the reference clock signal 102. The reference clock signal 102 may be useful to maintain accuracy over a long period of time, such as to overcome drift that may occur after a few minutes, hours, etc. As discussed above, the reference clock signal 86 may be provided from the crystal oscillator 62 within the shielded area 54. Furthermore, the reference clock signal 86 may be a multiple of the clock signal 82 output from the crystal oscillator 62 (e.g., the reference clock signal 86 may have previously been divided). In other embodiments, the reference clock signal 86 may be received directly from the crystal oscillator 62, or another oscillator.

The control circuitry 92 may also receive a feedback clock signal 106 from a divider 108. The divider 108 receives an intermediate clock signal 110 from a first output divider 112. The control circuitry 92 may use the reference clock signal 102 and the feedback clock signal 106 to determine the control signals 90 provided to the silicon-based oscillator 88 to calibrate the silicon-based oscillator 88. For example, the control circuitry 92 may compare the reference clock signal 102 and the feedback clock signal 106, and calibrate the silicon-based oscillator 88 based on a difference between the reference clock signal 102 and the feedback clock signal 106. By calibrating the silicon-based oscillator 88, the output clock frequency 74 may be maintained within a desired range of frequencies. The output clock frequency 74 may be calibrated periodically, such as at a settable frequency. In the illustrated embodiment, the clock frequency 98 from the silicon-based oscillator 88 is divided by the divider 112 to produce the intermediate clock signal 110. Furthermore, the intermediate clock signal 110 is divided by a divider 114 to produce the output clock frequency 74.

Figure 6:
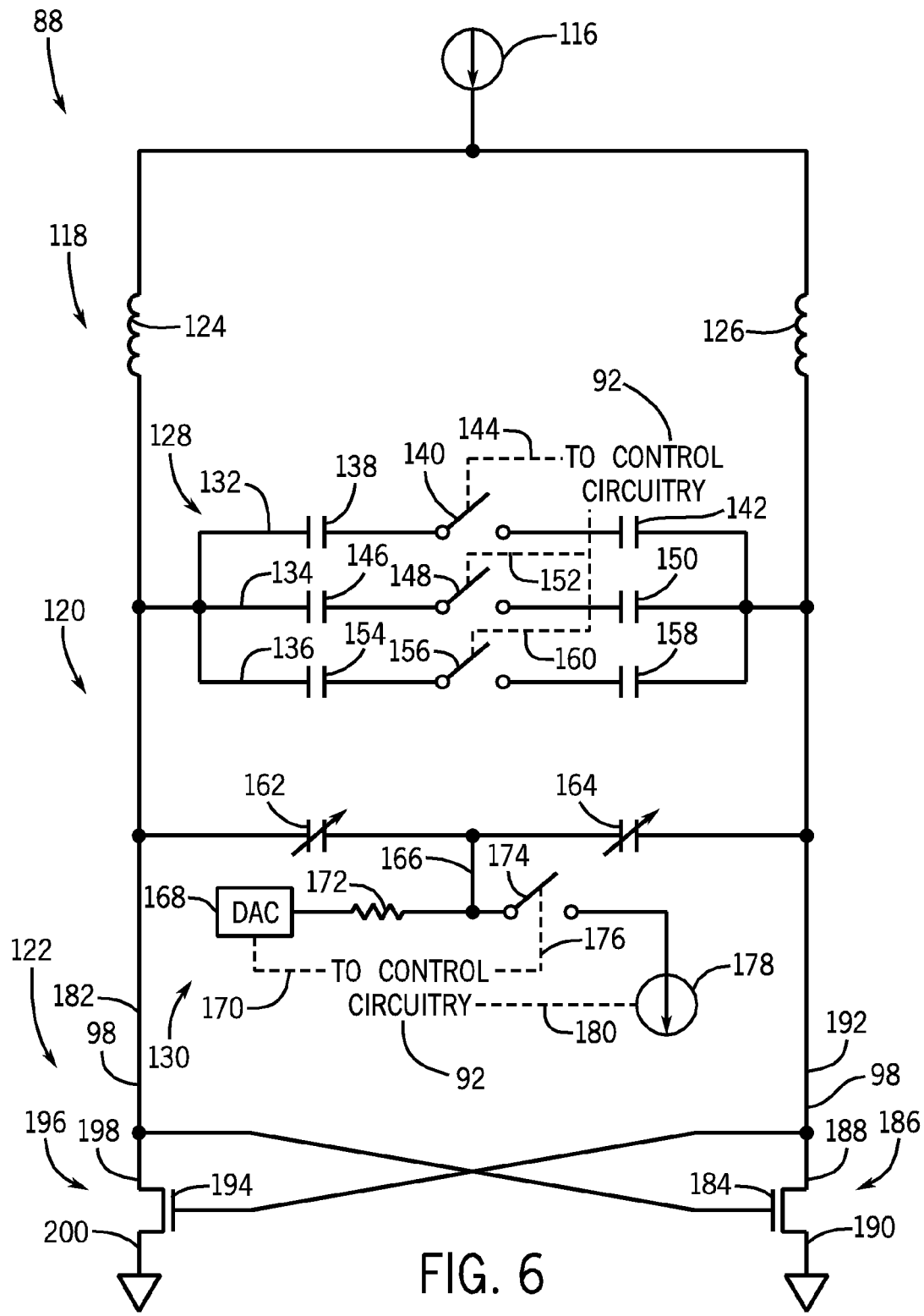
FIG. 6 is a schematic diagram of a silicon-based oscillator with control signal inputs, in accordance with an embodiment.

The silicon-based oscillator 88 may be an LC oscillator as shown in FIG. 6. Specifically, the silicon-based oscillator 88 may be powered by a current source 116 (or a voltage source), as illustrated. The silicon-based oscillator 88 includes an inductor circuit 118, a variable capacitor circuit 120, and a switching circuit 122. During operation, current flows from the current source 116 and through the inductor circuit 118, the variable capacitor circuit 120, and the switching circuit 122 to produce the clock frequency 98. As illustrated, the inductor circuit 118 includes a first inductor 124 electrically coupled to a first end of the variable capacitor circuit 120 and a second inductor 126 electrically coupled to a second end of the variable capacitor circuit 120.

The variable capacitor circuit 120 includes a coarse tuning circuit 128 and a fine tuning circuit 130. The coarse tuning circuit 128 is used to change the clock frequency 98 by switching in fixed capacitors, thereby changing the clock frequency 98 in a stepwise fashion. Moreover, the fine tuning circuit 130 is used to change the clock frequency 98 by changing a capacitance of variable capacitors, thereby changing the clock frequency 98 in a linear fashion.

The coarse tuning circuit 128 includes three selectable capacitor rows. Specifically, the coarse tuning circuit 128 includes a first selectable row 132, a second selectable row 134, and a third selectable row 136. As may be appreciated, the coarse tuning circuit 128 may include fewer or more selectable capacitor rows. The first selectable row 132 includes a first capacitor 138, a switch 140, and a second capacitor 142. The switch 140 may be controlled using a control signal 144 coupled to the control circuitry 92. Moreover, the second selectable row 134 includes a first capacitor 146, a switch 148, and a second capacitor 150. The switch 148 may be controlled using a control signal 152 coupled to the control circuitry 92. Furthermore, the third selectable row 136 includes a first capacitor 154, a switch 156, and a second capacitor 158. The switch 156 may be controlled using a control signal 160 coupled to the control circuitry 92. The capacitors for each row may be selected so that the capacitance of one row is twice the capacitance of an adjacent row. For example, the first selectable row 132 may have a total capacitance C, the second selectable row 134 may have a total capacitance 2*C, and the third selectable row 136 may have a total capacitance 4*C. Accordingly, in the present embodiment, the control circuitry 92 may provide the control signals 144, 152, and 160 to result in up to eight different fixed capacitances for the coarse tuning circuit 128, as illustrated in TABLE 1.

TABLE 1

| Switch 156 | Switch 148 | Switch 140 | Total Capacitance |
|---|---|---|---|
| Open | Open | Open | 0*C |
| Open | Open | Closed | 1*C |
| Open | Closed | Open | 2*C |
| Open | Closed | Closed | 3*C |
| Closed | Open | Open | 4*C |
| Closed | Open | Closed | 5*C |

TABLE 1-continued

| Switch 156 | Switch 148 | Switch 140 | Total Capacitance |
|---|---|---|---|
| Closed | Closed | Open | 6*C |
| Closed | Closed | Closed | 7*C |

The eight different fixed capacitances shown in TABLE 1 may further correspond to eight different output frequencies. Therefore, the control signals 144, 152, and 160 may be used to select an output frequency of the silicon-based oscillator 88. Although three selectable capacitor rows 132, 134, and 136 are illustrated, any suitable number (e.g., N) of selectable capacitor rows may be part of the coarse tuning circuit 128. Accordingly, with N number of rows, there may be 2^N number of possible combinations for Total Capacitance from the coarse tuning circuit 128. As may be appreciated, the silicon-based oscillator 88 may operate at any suitable frequency. For example, in certain embodiments, the silicon-based oscillator 88 may operate at frequencies between approximately 1 to 50 MHz.

The fine tuning circuit 130 operates to change the clock frequency 98 in a linear fashion using variable capacitors. Specifically, the fine tuning circuit 130 includes a first variable capacitor 162 and a second variable capacitor 164. The first and second variable capacitors 162 and 164 may be any suitable variable capacitors, such as varactors. For example, the first and second variable capacitors 162 and 164 may both be varactors arranged in a back-to-back series configuration. A conductor 166 is used to provide a signal to the first and second variable capacitors 162 and 164 to change the capacitance of the variable capacitors. For example, the capacitance of the variable capacitor 162 may change based on a voltage across the conductors 166 and 182. Moreover, the capacitance of the variable capacitor 164 may change based on a voltage across the conductors 166 and 192.

The signal on the conductor 166 may be controlled using various control signals from the control circuitry 92. For example, a DAC 168 receives a control signal 170 from the control circuitry 92 to control an input digital signal provided to the DAC 168. The DAC 168 converts the digital signal to an analog output. A resistor 172 is electrically coupled between the DAC 168 and the conductor 166. Accordingly, the control signal 170 may be used to control the signal applied to the conductor 166. As may be appreciated, changing the control signal 170 received by the DAC 168 changes the voltage on the conductor 166, and thereby changes the voltage across the variable capacitors 162 and 164. Further, changing the voltage across the variable capacitors 162 and 164 changes their capacitance. Moreover, a switch 174 is controlled by a control signal 176 of the control circuitry 92. The switch 174 selectively couples a current source 178 to the conductor 92. The current source 178 may be a proportional to absolute temperature (PTAT) source. As illustrated, the current source 178 is further controlled by a control signal 180 of the control circuitry 92. In certain embodiments, the control signal 180 may be used to change a current gain of the current source 178. After the current gain is set, the current source 178 may be used for temperature compensation based on a change in temperature without interruption by the control circuitry 92.

As described above, the fine tuning circuit 130 may use the control signals 170, 176, and 180 to change the capacitance of the variable capacitors 162 and 164, thereby changing the clock frequency 98 in a linear fashion. For example, the combined capacitance of the variable capacitors 162 and 164 may be between 0 and C. Accordingly, the capacitance of the variable capacitors 162 and 164 may be varied to change the clock frequency 98 for frequencies that correspond to a capacitance of between 0 and C.

The variable capacitor circuit 120 has a combined capacitance from the coarse tuning circuit 128 and the fine tuning circuit 130. By combining the capacitance from the coarse tuning circuit 128 and the fine tuning circuit 130, the variable capacitor circuit 120 may have a variable capacitance between 0 and 8*C. Specifically, the coarse tuning circuit 128 may be used to control stepwise capacitance changes, while the fine tuning circuit 130 may be used to control linear capacitance changes. When combined, the variable capacitor circuit 120 may be controlled to operate as if it had continuous capacitance between 0 and 8*C. For example, the coarse tuning circuit 128 may initially have the switches 140, 148, and 156 in the open position. The fine tuning circuit 130 may initially start with near zero capacitance. Moreover, the fine tuning circuit 130 may be changed until it has approximately 1*C capacitance. At this point, the control circuitry 92 may close the switch 140 and return the fine tuning circuit 130 to near zero capacitance at approximately the same time, resulting in approximately 1*C capacitance from the coarse tuning circuit 128 for a total capacitance of variable capacitor circuit 120 of approximately 1*C capacitance. The variable capacitor circuit 120 may be controlled to other capacitance values in a similar manner. In certain implementations, the range of the fine tuning circuit 130 may be wider than 1*C capacitance so that there are no gaps in the overall control range. Such gaps may be present due to tolerances in different capacitors used. Further, as may be appreciated, the total capacitance of the variable capacitor circuit 120 may not get as low as zero. For example, the total capacitance of the variable capacitor circuit 120 may range anywhere between C1 and C2, where C2 is greater than C1. In such an embodiment, the amount of change of the variable capacitor circuit 120 (e.g., C2−C1) may be substantially larger than 1*C.

A first output 182 from the variable capacitor circuit 120 may be used to control a gate 184 of a switching device 186 (e.g., transistor, MOSFET, etc.). When the gate 184 has a voltage applied to it, current may flow from a drain 188 of the switching device 186 to a source 190 of the switching device 186. The current may then be used to provide the clock frequency 98. Furthermore, a second output 192 from the variable capacitor circuit 120 may be used to control a gate 194 of a switching device 196 (e.g., transistor, MOSFET, etc.). When the gate 194 has a voltage applied to it, current may flow from a drain 198 of the switching device 196 to a source 200 of the switching device 196. The current may then be used to provide the clock frequency 98. As such, the clock frequency 98 may be formed by an alternation between the voltage of the first output 182 relative to reference (e.g., ground) and the voltage of the second output 192 relative to reference (e.g., ground).

Figure 7:
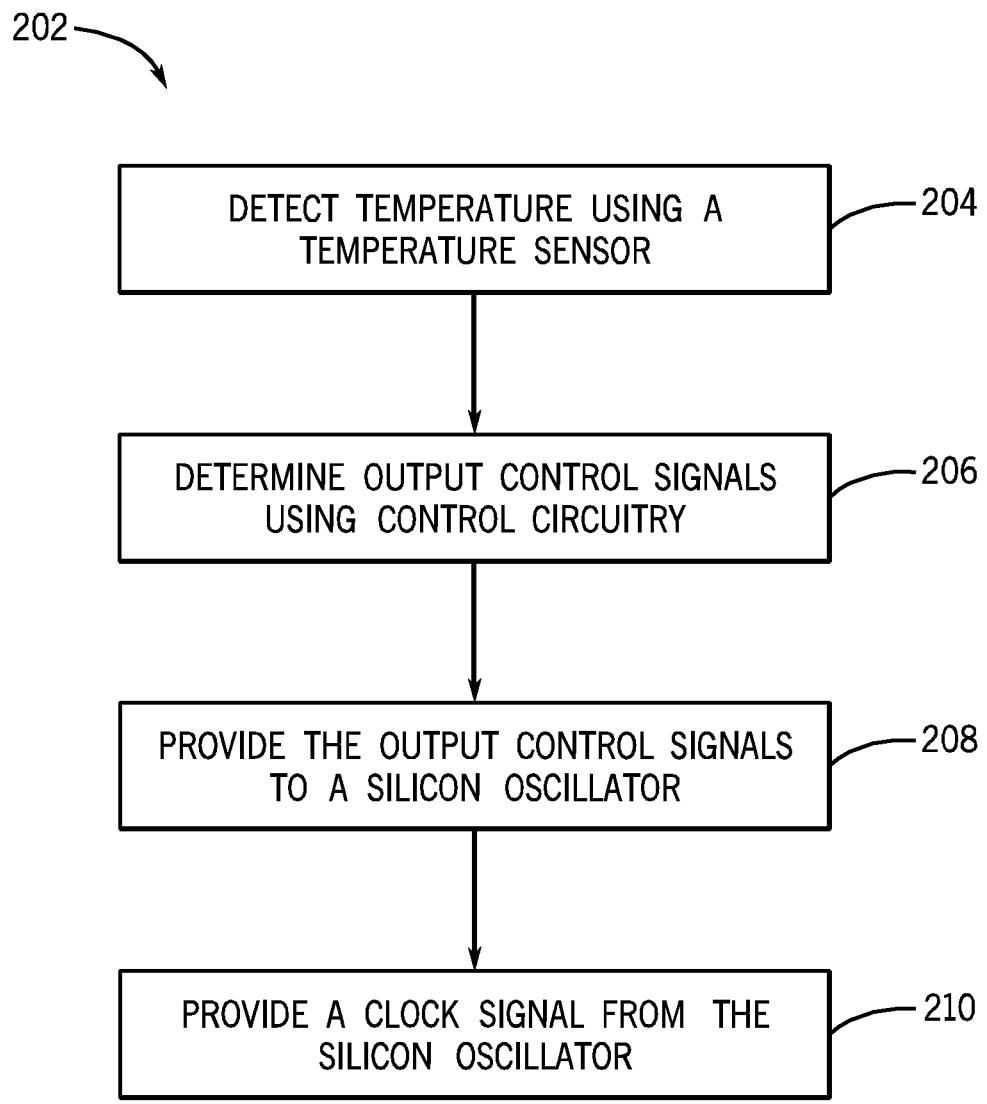
FIG. 7 is a flowchart of a method for producing clock signals from a silicon-based oscillator, in accordance with an embodiment.

Clock signals may be produced from the silicon-based oscillator 88 in a variety of ways, such as by using a method 202 as shown in the flowchart of FIG. 7. For example, a temperature of the silicon-based oscillator assembly 72 may be detected by the silicon-based oscillator assembly 72 using a temperature sensor (block 204). The temperature sensor may be the temperature sensor 96 of the silicon-based oscillator assembly 72, one of the sensors 78, or any suitable sensor. Moreover, the silicon-based oscillator assembly 72 may determine output control signals 90 using control circuitry 92 of the silicon-based oscillator assembly 72 based on the detected temperature (block 206). In certain embodiments, determining the output control signals 90 may include using the detected temperature as an index for a lookup table stored on the silicon-based oscillator assembly 72 (or stored externally), and may include retrieving the output control signals 90 that correspond to the detected temperature found in the lookup table.

The control circuitry 92 may provide the output control signals 90 to the silicon-based oscillator 88 (block 208). As discussed above, the silicon-based oscillator 88 may include the inductor circuit 118 and the variable capacitor circuit 120. Providing the output control signals 90 may include providing a coarse control signal to select fixed capacitors of the variable capacitor circuit 120 to be used in determining the frequency of the clock frequency output 98. Moreover, providing the output control signals 90 may include providing a fine control signal to change a capacitance of the variable capacitor circuit 120 to change the frequency of the clock frequency output 98. In certain embodiments, providing the output control signals 90 may include providing a signal to change a current provided to the variable capacitor circuit 120 to change a capacitance of the variable capacitor circuit 120. The silicon-based oscillator 88 may provide the clock frequency output 98 using the inductor circuit 118, the variable capacitor circuit 120, and/or the output control signals 90 (block 210). Using such a method 202, the silicon-based oscillator assembly 72 may be used to provide the clock frequency output 98 within a desired range of frequencies.

As explained herein, the silicon-based oscillator assembly 72 may be used to provide clock signals that are reliable and stable even when operating in extreme environmental conditions, such as high pressure, high temperature, and high stress environments. Accordingly, reliable clock signals may be provided by the silicon-based oscillator assembly 72 outside of the shielded area 54.

It will be appreciated that while drilling systems such as MWD and LWD systems have been provided as examples in this specification, the present techniques may apply to any MWD tool, LWD tool, wireline tool, coiled tubing tool, testing tool, completions tool, production tool, or combinations thereof.

The specific embodiments described above have been shown by way of example, and it should be understood that these embodiments may be susceptible to various modifications and alternative forms. It should be further understood that the claims are not intended to be limited to the particular forms disclosed, but rather to cover modifications, equivalents, and alternatives falling within the spirit and scope of this disclosure.

What is claimed is:

1. An oscillator assembly comprising:
   a silicon-based oscillator having a variable capacitor circuit, wherein the silicon-based oscillator is configured to provide an output signal at a frequency within a range of frequencies; and
   control circuitry electrically coupled to the silicon-based oscillator, wherein the control circuitry comprises a temperature input configured to receive a temperature corresponding to the silicon-based oscillator, and the control circuitry comprises a control signal output electrically coupled to the silicon-based oscillator and configured to change a capacitance of the variable capacitor circuit based on the temperature received by the temperature input to maintain the output signal of the silicon-based oscillator within the range of frequencies; and
   a divider coupled to the silicon-based oscillator, wherein the divider comprises divider circuitry and multiplier circuitry to facilitate division, multiplication, or combinations of both on the output signal of the silicon-based oscillator to output an output clock frequency from the oscillator assembly.

2. The oscillator assembly of claim 1, wherein the silicon-based oscillator comprises an inductor circuit having a first inductor electrically coupled to a first end of the variable capacitor circuit and a second inductor electrically coupled to a second end of the variable capacitor circuit.

3. The oscillator assembly of claim 1, wherein the variable capacitor circuit comprises one or more variable capacitors having a variable capacitance.

4. The oscillator assembly of claim 3, wherein the one or more variable capacitors comprises at least one varactor.

5. The oscillator assembly of claim 3, wherein the control signal output of the control circuitry is configured to change the variable capacitance of the one or more variable capacitors.

6. The oscillator assembly of claim 1, wherein the variable capacitor circuit comprises a plurality of fixed capacitors.

7. The oscillator assembly of claim 6, wherein at least one fixed capacitor of the plurality of fixed capacitors is configured to be selectively coupled to the inductor circuit, and wherein the control signal output of the control circuitry is configured to control whether the at least one fixed capacitor is coupled to the inductor circuit.

8. The oscillator assembly of claim 1, wherein the output signal comprises a clock signal.

9. The oscillator assembly of claim 1, wherein the control circuitry is configured to receive a clock input, and to control the control signal output using the clock input to maintain the output signal of the silicon-based oscillator within the range of frequencies.

10. The oscillator assembly of claim 1, wherein the control circuitry is configured to receive the output signal from the silicon-based oscillator, and to control the control signal output using the output signal to maintain the output signal within the range of frequencies.

11. A method comprising:
    detecting a temperature using a temperature sensor of an oscillator assembly;
    determining output control signals using control circuitry of the oscillator assembly based on the detected temperature;
    providing the output control signals from the control circuitry to a silicon-based oscillator of the oscillator assembly, wherein the silicon-based oscillator comprises an inductor circuit and a variable capacitor circuit;
    providing a clock frequency from the silicon based oscillator to one or more dividers to increase or decrease the clock frequency and output an intermediate signal;
    providing the intermediate signal as a feedback signal to the control circuitry; and
    providing a clock signal from the oscillator assembly, wherein a frequency of the clock signal is determined using the inductor circuit, the variable capacitor circuit, the one or more dividers, and the output control signals.

12. The method of claim 11, wherein determining the output control signals using the control circuitry of the oscillator assembly based on the detected temperature comprises using the detected temperature as an index for a lookup table and retrieving the output control signals that correspond to the detected temperature in the lookup table.

13. The method of claim 11, wherein providing the output control signals from the control circuitry to the silicon-based oscillator comprises providing a coarse control signal configured to select one or more fixed capacitors of the variable capacitor circuit to be used in determining the frequency of the clock signal.

14. The method of claim 11, wherein providing the output control signals from the control circuitry to the silicon-based oscillator comprises providing a fine control signal configured to change a capacitance of the variable capacitor circuit to change the frequency of the clock signal.

15. The method of claim 11, wherein providing the output control signals from the control circuitry to the silicon-based oscillator comprises providing a signal to change a current provided to the variable capacitor circuit to change a capacitance of the variable capacitor circuit.

* * * * *